United States Patent [19]
Wolf et al.

[11] Patent Number: 5,512,773
[45] Date of Patent: Apr. 30, 1996

[54] SWITCHING ELEMENT WITH MEMORY PROVIDED WITH SCHOTTKY TUNNELLING BARRIER

[75] Inventors: Ronald M. Wolf; Paulus W. M. Blom; Marcellinus P. C. M. Krijn, Eindhoven, all of Netherlands

[73] Assignee: U.S. Philips Corporation, New York, N.Y.

[21] Appl. No.: 359,375

[22] Filed: Dec. 20, 1994

[30] Foreign Application Priority Data

Dec. 23, 1993 [BE] Belgium ................. 09301444

[51] Int. Cl.⁶ .................. H01L 27/095; G11C 11/22
[52] U.S. Cl. .................. 257/471; 257/476; 365/145; 365/174
[58] Field of Search ................... 257/471, 476; 365/145, 174

[56] References Cited

U.S. PATENT DOCUMENTS

| | | | |
|---|---|---|---|
| 3,623,030 | 11/1971 | Sawyer | 257/473 |
| 5,206,829 | 4/1993 | Thakoor et al. | 365/145 |

FOREIGN PATENT DOCUMENTS 60-182762  9/1985  Japan.

OTHER PUBLICATIONS

"Nonvolatile Schottky Diode With Barrier Height Controlled by Ferroelectric Polarization", IBM Technical Disclosure Bulletin, vol. 14, No. 4, Sep. 1971, pp. 1250–1251.

Primary Examiner—Mark V. Prenty
Attorney, Agent, or Firm—Steven R. Biren

[57] ABSTRACT

A switching element is provided with two electrodes (1, 2) with a semiconducting dielectric (3) therebetween, one electrode (2) having a material which forms a Schottky contact with the semiconducting dielectric (3), while a space charge region (3') of the Schottky contact forms a tunnelling barrier for electrons during operation. It is desirable in many applications for the switching element to hold a certain switching state, such as open or closed, during a longer period. The switching element may then be used, for example, as a memory element. The dielectric (3) includes a ferroelectric material with a remanent polarization which influences a dimension of the tunnelling barrier. In this manner the switching element has various switching states depending on the remanent polarization of the dielectric (3). These switching states are held until the polarization of the dielectric (3) changes.

9 Claims, 1 Drawing Sheet

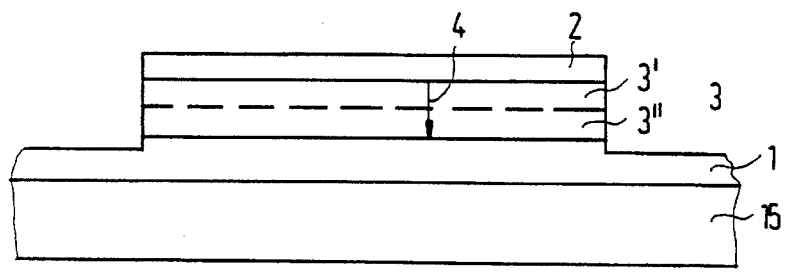
FIG.1
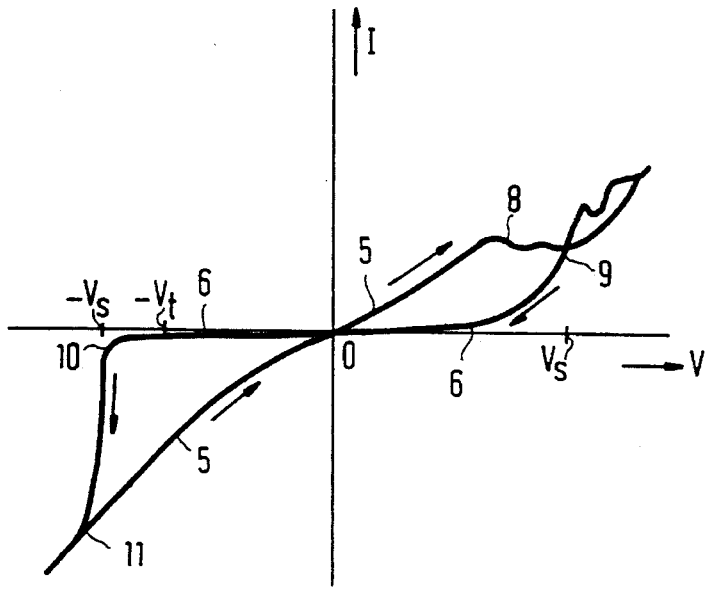
FIG.2
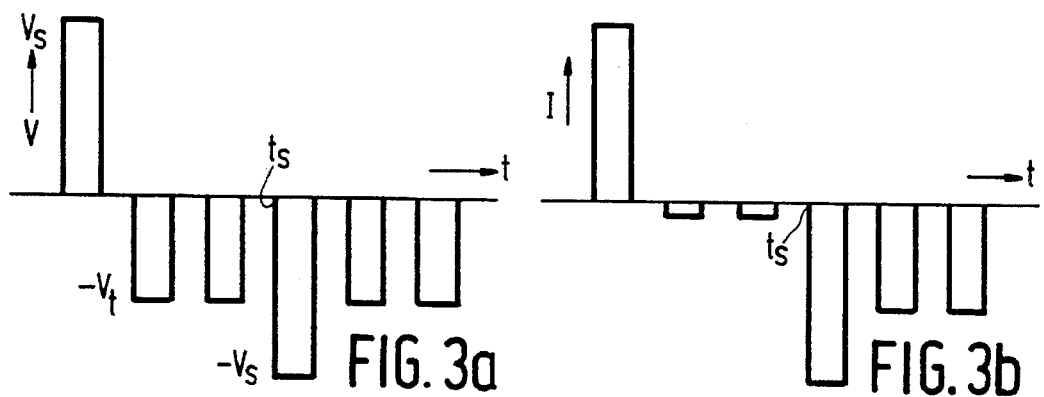
FIG.3a
FIG.3b
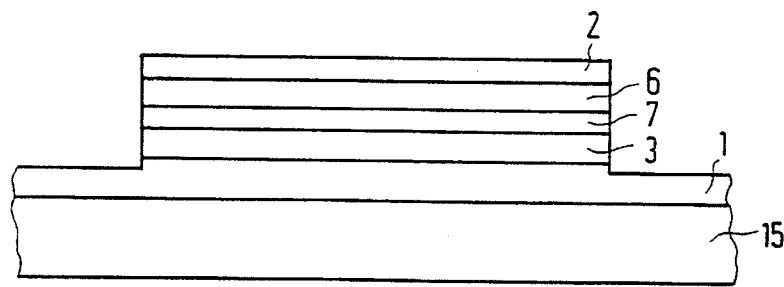
FIG.4

SWITCHING ELEMENT WITH MEMORY PROVIDED WITH SCHOTTKY TUNNELLING BARRIER

BACKGROUND OF THE INVENTION

The invention relates to a switching element provided with two electrodes with a semiconducting dielectric therebetween, one electrode comprising a material which forms a Schottky contact with the semiconducting dielectric, with a space charge region of the Schottky contact forming a tunnelling barrier for electrons during operation. The invention also relates to a memory element.

Japanese Patent Application no. 60-182762 discloses a device of the kind mentioned in the opening paragraph with a first electrode of titanium, a dielectric of an n-type semiconducting oxide of tungsten, and a second electrode of iridium. The iridium of the second electrode and the dielectric form a Schottky contact whose space charge region forms the tunnelling barrier in the dielectric for electrons which are transported from the one to the other electrode. The known switching element has a memory which is obtained through ageing or the switching element by means of a voltage across the dielectric. This voltage moves ions through the dielectric. These ions influence the space charge region of the Schottky contact and thus the tunnelling barrier so that switching states arise in which more or less current is allowed through. The switching states are held during a certain period.

The known device described has the disadvantage that a switching state of the switching element is held for a short time only, i.e. no more than a few tens of seconds.

SUMMARY OF THE INVENTION

The invention has for its object inter alia to counteract this disadvantage.

According to the invention, the device is characterized in that the dielectric comprises a ferroelectric material with a remanent polarization which influences a dimension of the tunnelling barrier. The term dimension of the tunnelling barrier is here understood to mean a width and height of a potential jump which forms the tunnelling barrier. The term remanent polarization is understood to mean that polarization which the ferroelectric dielectric has when no electric field is applied across the dielectric.

It is achieved thereby that a switching state of the switching element can be held substantially indefinitely. It is suspected that the following physical process plays a part. During operation, a space charge region belonging to the Schottky contact is formed in a portion of the dielectric adjoining the electrode having the higher work function. Electron can be transported from the one to the other electrode by tunnelling through the space charge region and by transport through the further portion of the semiconducting dielectric. The remanent polarization in the space charge region is mainly determined by the great internal electric field caused by the space charge. By applying a voltage across the electrodes and thus introducing an additional electric field in the dielectric, it is possible to change the remanent polarization of the dielectric outside the space charge region, and possibly also inside the space charge region. The polarization directions of the dielectric inside and outside the space charge region may be parallel or antiparallel. When the polarization directions inside and outside the space charge region are parallel, the thickness of the space charge region is reduced owing to a strong curvature of the electron energy bands in the dielectric. The potential jump accompanying the tunnelling barrier then becomes less wide and/or high. It is then easier for electrons to tunnel through the space charge region. The switching element is "closed" in that case. However, when the polarization directions inside and outside the space charge region are antiparallel, the thickness of the space charge region increases and the band curvature becomes less. The potential jump then becomes wider and higher. Electrons find it more difficult to tunnel through the Schottky barrier. The switching element is "open" in that case. Whatever physical process may be active here, the switching element has different switching states as a result. The switching state is held until the remanent polarization of the dielectric outside the space charge region changes.

The switching element according to the invention is operated at temperatures which are usual for semiconductor devices, i.e. at temperatures of between −50° and +250° C.

It is noted that ferroelectric switching elements, so-called varistors, are known. These switching elements, however, do not hold a switching state; they have no memory.

A ferroelectric material may be brought from one polarization state into another by the application of such a voltage across the material that an electric switching field belonging to that ferroelectric material is exceeded in that ferroelectric material. The polarization direction in the ferroelectric material then changes. In the switching element according to the invention, it is suspected that the dielectric material outside the space charge region is switched from one polarization direction into the other in order to realize different switching states. A voltage is applied across the electrodes of the switching element for this purpose. In practice, a major portion of this voltage is across the space charge region, namely as the potential jump belonging to the tunnelling barrier, and only a small portion across the dielectric outside the space charge region. The width and height of the potential jump across the space charge region are only slightly dependent on the thickness of the entire dielectric, which thickness of the dielectric is defined in a direction perpendicular to the electrodes. The voltage across the space charge region, however, must remain limited because breakdown occurs at a too high voltage across the space charge region. Preferably, the dielectric has such a small thickness that it is possible to achieve a switching field of the ferroelectric material in a region of the dielectric outside the space charge region by means of a voltage across the electrodes without breakdown occurring in the space charge region. It is found in practice that no problems involving breakdown of the space charge region occur with a dielectric thickness below 5000 Å.

The remanent polarization in a ferroelectric material may have different dimensions in different directions, depending on the structure of the dielectric. The value and the direction of the remanent polarization influences the dimension, i.e. the width and the height of the potential jump accompanying the Schottky tunnelling barrier. Preferably, the electrodes are in the form of substantially parallel plates and a direction of a greatest component of the remanent polarization is substantially perpendicular to said plates. The direction of this greatest component of the remanent polarization is then parallel or antiparallel to the electric field between the electrodes. The effect of the remanent polarization on the dimension of the tunnelling barrier is then at its maximum.

Such a material is obtained when the ferroelectric dielectric is provided epitaxially on an electrode of a metallically conducting oxide. The ferroelectric dielectric may be rendered semiconducting in various ways, for example, through the provision of dopant atoms or the provision of lattice vacancies in non-conducting metal oxides. The growing direction of the ferroelectric dielectric is preferably chosen such that a preferred polarization axis of the ferroelectric material, which indicates the direction of the greatest component of the remanent polarization, is substantially parallel to the plates. The dielectric then has a structure such that the remanent polarization has its maximum size, while the direction of the polarization is parallel to the electric field to be applied between the electrodes.

The metallically conducting electrode and the ferroelectric dielectric may be provided on a non-crystalline substrate. Preferably, however, the metallically conducting electrode is provided on a monocrystalline substrate. The monocrystalline substrate preferably has a satisfactory lattice matching (+−10%) with the conducting oxide used for the electrode and the ferroelectric dielectric. An epitaxially provided ferroelectric dielectric is relatively easy to manufacture in that case.

In a further embodiment, the dielectric comprises two or more ferroelectric materials which change the directions of their remanent polarization at different electric switching fields. The switching element then has more than two switching states. The dielectric may have been grown, for example, in the form of two layers with different ferroelectric properties on a first electrode. A second electrode is then provided on these layers. In this embodiment, it is only necessary for the ferroelectric dielectric belonging to the Schottky contact to be semiconducting. In a further embodiment, a conducting layer is provided between the different ferroelectric materials so that the switching element comprises a number of elements connected in series. A switching element then comprises, for example, a structure such as $M_1FM_2F'M_3$, in which $M_1$, $M_2$, $M_3$ are conducting electrode materials and F and F' are ferroelectric semiconductor materials which change the directions of their remanent polarization at different electric switching fields. Preferably, only one Schottky contact is present here. Depending on the dimension and the direction of the remanent polarizations of the ferroelectric dielectrics F and F', the current increases or decreases, so that the switching element has more than two switching states. The presence of an electrode between two dielectrics in addition prevents coupling of dielectric domains in the two ferroelectric materials.

The invention also relates to a memory element which comprises a switching element according to the invention. Known memory elements comprise capacitances in which the amount of charge on the capacitances form a measure for the information. The read-out procedure of known memory elements is cumbersome. During read-out, a certain voltage is applied to a capacitance, upon which the charge flowing towards the capacitance is measured. The value of this charge is a measure for the charge which was present on the capacitance. After read-out, the information originally present has disappeared, so that this information has to be written into the capacitance again. In a memory element according to the invention, a voltage is applied across the switching element during read-out, after which the current through this element is measured. Measuring a current is much simpler than measuring a charge. The information in the switching element is not affected by the read-out. The read-out procedure for a memory element according to the invention is thus much simpler than the procedure for a known memory element.

BRIEF DESCRIPTION OF THE DRAWING

The invention will be explained below in more detail by way of example with reference to an embodiment with the accompanying diagrammatic drawing, in which:

FIG. 1 shows a switching element according to the invention,

FIG. 2 is a current-voltage characteristic of a switching element according to the invention, FIGS. 3a and 3b show a write-read cycle of a memory element according to the invention, and FIG. 4 shows a switching element according to the invention in which the dielectric comprises two ferroelectric materials with different electric switching fields.

The Figures are purely diagrammatic and not drawn to scale. Corresponding pans have generally been given the same reference numerals in the Figures.

DESCRIPTION OF THE PREFERRED EMBODIMENTS

FIG. 1 shows a switching element provided with two electrodes 1, 2 in the form of substantially parallel plates with a semiconducting dielectric 3 therebetween, one electrode 2 comprising a material which forms a Schottky contact with the semiconducting dielectric 3, while during operation a space charge region 3' of the Schottky contact constitutes a tunnelling barrier for electrons.

Such a switching element is known, ions in the dielectric 3 influencing the space charge region 3'. The ions may be sent from one location in the dielectric 3 to a different location by means of a voltage across the electrodes 1, 2. Depending on the location of the ions, the space charge region 3' becomes greater or smaller. The known switching element thus has switching states which can be held for a few tens of seconds. In many applications, however, it is desirable for the switching element to maintain a certain switching state, such as open/closed, for a longer time. In addition, it is often desirable for a switching element to be capable of fast switching from the one switching state into the other. The transport of ions in the known switching element is relatively slow.

According to the invention, the dielectric 3 comprises a ferroelectric material with a remanent polarization which influences a dimension of the tunnelling barrier. The switching element then has different switching states depending on the remanent polarization of the dielectric 3. It is achieved thereby that the switching state of the switching element can be maintained substantially indefinitely. It is suspected that the following physical process plays a part. A space charge region 3' belonging to the Schottky contact is formed in a portion of the dielectric 3 which adjoins the electrode 2. Electrons can be transported from the one to the other electrode 1, 2 by tunnelling through the space charge region 3' and by transport through the further portion 3" of the semiconducting dielectric 3. The internal electric field in the space charge region 3' is very strong owing to the space charge. The remanent polarization of the ferroelectric dielectric 3 in the space charge region 3', accordingly, is determined by this strong electric field. The polarization of the further portion 3" of the dielectric 3 outside the space charge region 3' can be oriented in that a voltage is applied across the electrodes 1, 2, whereby an additional electric field is introduced in the dielectric 3. This polarization may be parallel or antiparallel to the polarization in the space charge region 3'. When the polarizations inside and outside the space charge region are parallel, the thickness of the space charge region 3' becomes less owing to a strong curvature of the electron energy bands in the dielectric 3. It becomes easier then for electrons to tunnel through the space charge region 3'. The switching element then is "closed". However, when the polarizations inside and outside the space charge region 3' are antiparallel, the thickness of the space charge region 3' becomes greater and the band curvature becomes less. It is less easy then for electrons to tunnel through the Schottky barrier. The switching element is "open" in that case. So the switching element has different switching states. The switching state is held until the remanent polarization of the further portion 3" of the dielectric 3 outside the space charge region 3' changes.

The ferroelectric dielectric 3 may be switched from one polarization state into another in that a voltage is applied across the dielectric 3 such that an electric switching field of the ferroelectric material is exceeded in the dielectric 3.

FIG. 2 is a current-voltage characteristic of a switching element according to the invention. An ohmic contact is here formed between electrode 1 and the dielectric 3, while the Schottky contact is formed between electrode 2 and the dielectric 3. The current-voltage characteristic of FIG. 2 breaks down into two curves 5, 6 which correspond to different directions of the remanent polarization. When there is no voltage V applied to the switching element, no current I flows through the element (point O in FIG. 2). When the voltage V across the dielectric 3 increases and the remanent polarization in the dielectric 3" outside the space charge region is parallel to the electric field applied, the current rises in accordance with curve 5. The switching field for switching over the polarization is reached in the ferroelectric dielectric at point 8 on curve 5. The remanent polarization in the ferroelectric dielectric 3' then changes from parallel to antiparallel in relation to the electric field. The current through the switching element then drops until point 9 on curve 6 is reached. When the voltage decreases after reaching point 9, the current will follow curve 6. Substantially no current flows through the switching element then; the switching element is open. Upon reaching point 10 on curve 6, the electric field is so large that the remanent polarization of the dielectric again changes direction. The current then decreases until the value belonging to point 11 on curve 5 is reached. If the voltage decreases further, the current will decrease in accordance with curve 5 until the dielectric breaks down. If the voltage rises after reaching point 11, the current will follow curve 5.

In practice, the switching element is switched in that a voltage pulse of such a value is applied across the dielectric that the remanent polarization of the dielectric changes. The switching element is then read out at voltages lower than the voltage belonging to the switching field of the remanent polarization.

FIG. 3 shows a write-read cycle of the switching element. The time t is plotted on the horizontal axis, and the voltage V across the switching element (FIG. 3a) and the current I through the switching element (FIG. 3b) are plotted on the vertical axis. At a moment t=0, a positive write pulse $V_s$ is applied to the electrodes of such a value that the positive switching field of the dielectric 3 is exceeded. The current-voltage relation is then given by curve 6 of FIG. 2. Then a read pulse with an amplitude of between 0 and $-V_t$ volts is applied to the electrodes 1, 2 for reading out the switching state of the switching element (see FIG. 2). Substantially no current flows through the switching element then. The switching element is open. At moment $t=t_s$, a negative write pulse $-V_s$ is applied to the electrodes of such a value that the negative switching field of the dielectric 3 is exceeded, so that the current-voltage relation is given by curve 5 of FIG. 2. Then the read pulse with an amplitude of between 0 and $-V_t$ is applied to the electrodes 1, 2 again (see FIG. 2) for reading out the switching state of the switching element. A comparatively strong current I then flows through the switching element. The switching element is closed.

In the switching element according to the invention, the dielectric material 3" outside the space charge region 3' is switched from one polarization direction into the other in order to realize different switching states. A voltage is applied across the electrodes 1, 2 of the switching element for this purpose. In practice, a major portion of this voltage is across the space charge region 3' and only a small portion across the dielectric 3" outside the space charge region 3'. The thickness of and the voltage drop across the space charge region 3' are only slightly dependent on the thickness of the entire dielectric 3. The voltage across the space charge region 3', however, must remain limited because breakdown will occur at a too high voltage across the space charge region 3'. Preferably, the dielectric 3 has such a small thickness that a switching field of the ferroelectric material can be achieved in a region of the dielectric 3" outside the space charge region 3' by means of an electric voltage across the electrodes 1, 2 without breakdown occurring in the space charge region 3'. It is found in practice that no breakdown problems occur in the space charge region 3' with a thickness of the dielectric below 5000 Å.

The remanent polarization in a ferroelectric material may have various dimensions in various directions, depending on the structure of the dielectric 3. The dimension and the direction of the remanent polarization influence the dimensions, i.e. the width and the height, of the potential jump belonging to the Schottky barrier. Preferably, the direction 4 of a greatest component of the remanent polarization is substantially perpendicular to the plates. The direction 4 of this greatest component of the remanent polarization is parallel or antiparallel to the electric field between the electrodes 1, 2 then. The polarization then has its maximum effect on the height and width of the tunnelling barrier.

Such a material is obtained when the ferroelectric dielectric 3 is provided epitaxially on an electrode 1 of a metallically conducting oxide. An ohmic contact is then created between this electrode 1 and the dielectric 3. The metallically conducting oxide layers comprise, for example, known materials such as lanthanum-strontium-cobalt oxide, strontium ruthenate, strontium vanadate or doped tin oxide. Various metal oxides may be used as the semiconducting ferroelectric dielectric 3, which oxides are semiconducting, for example, through the provision of dopant atoms or of lattice vacancies. Thus, for example, titanates with a perovskite structure perform satisfactorily. The growing direction of the ferroelectric dielectric 3 is so chosen that a preferred polarization axis of the ferroelectric material, which indicates how the greatest component of the remanent polarization is oriented, is substantially perpendicular to the plates. The dielectric 3 then has such a structure that the remanent polarization has its maximum dimensions, while the direction 4 of the polarization is parallel to the electric field to be applied between the electrodes 1, 2. The electrode 1 of metallically conducting oxide and the ferroelectric dielectric 3 are provided by standard techniques such as pulsed laser deposition (PLD), sputtering, molecular beam epitaxy (MBE) or metal organic chemical vapour deposition (MOCVD). The materials may be provided on a noncrystalline background. Preferably, however, the metallically conducting electrode is provided on a monocrystalline substrate 15. The monocrystalline substrate 15 preferably has a satisfactory lattice matching (+−10%) with the conducting oxide of the electrode 1 used and the ferroelectric dielectric 3. An epitaxially provided ferroelectric dielectric 3 is then comparatively easy to manufacture. For the monocrystalline substrate 15 it is possible to use, for example, strontium titanate, magnesium oxide, magnesium-aluminium oxide or lithium niobate. However, substrates 15 of silicon or gallium arsenide may also be used in conjunction with suitable buffer layers such as, for example, zirconium oxide stabilized with $Pr_6O_1$, MgO, or yttrium-stabilized zirconium oxide (YSZ).

An embodiment of the switching element is manufactured as follows. A monocrystalline magnesium aluminate crystal is used as the substrate 15. Such a crystal has a reasonable matching with the lanthanum-strontium cobaltate ($La_{0.5}Sr_{0.5}CoO_3$) used as the electrode 1. The lanthanum-strontium cobaltate is provided by PLD at 600° C. under 0.2 mbar oxygen atmosphere. A layer of lead titanate ($PbTiO_3(PT)$) of 2000 Å is provided as the ferroelectric dielectric 3 in the same manner in which the lanthanum-strontium cobaltate of the electrode 1 was provided, whereby a p-type semiconducting lead titanate is manufactured. The layer 3 then has an epitaxial structure. The remanent polarization is approximately 0.75 $C/m^2$. A gold layer is provided on the layer of lead timate 3 so as to form electrode 2. Gold forms a Schottky contact with the lead titanate 3. The electrode 2 and the dielectric 3 are then brought into a pattern by means of a standard lithography process and etching, by reactive ion etching or Ar ion etching. The structure is etched through down to in the electrode 1. A switching element as shown in FIG. 1 has then been created with a lanthanum-strontium cobaltate electrode 1, a 2000 Å thick lead timate dielectric 3, and a gold electrode 2. The current-voltage curve of such a switching element is shown in FIG. 2.

A second embodiment of the switching element is manufactured as follows. A monocrystalline GaAs wafer is used as the substrate 15. The GaAs wafer is provided with a buffer layer of MgO. MgO has a satisfactory matching (7%) with the strontium ruthenate ($SrRuO_3$) used as the electrode 1. The strontium ruthenate is provided by sputtering at a substrate temperature of 600° C. in an atmosphere containing oxygen to a thickness of 500 Å. A layer of 1000 Å $PbTiO_3$ is provided on this electrode as the ferroelectric dielectric by means of MOCVD at 700° C. and under a partial oxygen pressure of 4 mbar. Semiconducting $PbTiO_3$ is obtained thereby. The layer 3 has an epitaxial structure. The remanent polarization is approximately 0.75 $C/m^2$. A platinum layer is provided as the electrode 2 on the lead timate layer 3. Platinum has a high work function and forms a Schottky contact when provided on the lead titanate of the dielectric 3. The electrode 2 and the dielectric 3 are then brought into a pattern by means of a standard lithography process and etching, by reactive ion etching or Ar ion etching. The structure is etched through down to in the electrode 1.

A switching element as shown in FIG. 1 has then been created with a strontium ruthenate electrode 1, a 1000 Å thick lead titanate semiconducting dielectric 3, and a platinum electrode 2.

In a further embodiment, the dielectric 3 comprises several ferroelectric materials which change the directions of their remanent polarization at different electric switching fields. The switching element then has more than two switching states. FIG. 4 shows a switching element in which the dielectric 3 was grown in the form of two layers 3, 6 with different ferroelectric properties on a first electrode. A second electrode 2 is provided on this dielectric 3, 6. As an example, again, a strontium titanate substrate 15 is taken with a first electrode 1 of strontium ruthenate. A lead-zirconium titanate layer 3 of 500 Å is provided on this electrode 1 by MOCVD in the same manner as in the first embodiment. A second ferroelectric layer 6 of lead titanate is provided on this layer 3 in the manner described for embodiment 1, the composition being chosen in known manner such that a different switching field and remanent polarization are realised in this layer compared with the lead-zirconium timate layer 3. The dielectric 3 has a switching field of $10^6$ V/m and a remanent polarization of 0.23 $C/m^2$. The dielectric 6 has a switching field of $8 \times 10^6$ V/m and a remanent polarization of 0.75 $C/m^2$. Such a switching element has four switching states, depending on the directions of the remanent polarization of the dielectrics. When we indicate the direction 4 of the polarization with -> or <- for a polarization directed from electrode 1 to 2 or vice versa, respectively, the four switching states are: no. 1: dielectric 3 -> dielectric 6 ->; no. 2: dielectric 3 -> dielectric 6 <-; no. 3: dielectric 3 <- dielectric 6 ->; no. 4: dielectric 3 <- dielectric 6 <-. For equal values of the remanent polarizations, there will be only three switching states; switching states no. 2 and 3 are identical then. The switching element may also comprise more than two different ferroelectric dielectrics. The switching element will then have a correspondingly increased number of switching states.

In a further embodiment, a conductive layer 7 of $La_{0.5}Sr_{0.5}CoO_3$ is provided between the various ferroelectric materials, so that the switching element comprises a number of elements connected in series. A switching element then comprises, for example, a structure such as $M_1FM_2F'M_3$, in which $M_1$, $M_2$, $M_3$ are conductive electrode materials and F and F' are ferroelectric materials which change the directions of their remanent polarization at different electric switching fields. A Schottky contact is present between one of the conductive layers and the ferroelectric dielectric. Depending on the value and direction of the remanent polarizations of the ferroelectric dielectrics F and F', the current will be stronger or weaker, so that the switching element has more than two switching states. The presence of an electrode between two dielectrics in addition prevents coupling of dielectric domains in the two ferroelectric materials.

The invention also relates to a memory element which comprises a switching element according to the invention. Known memory elements comprise capacitances, the value of a charge on the capacitance being a measure for the information. The read-out procedure of known memory elements is cumbersome. A certain voltage is applied to a capacitance during read-out, upon which the charge flowing towards the capacitance is measured. The value of this charge is a measure for the value which was present at the capacitance. The information originally present has disappeared after the read-out, so that the original information must be written into the capacitances again. In a memory element according to the invention, a voltage is applied to the switching element during read-out, after which the current through the element is measured (see FIG. 3). Measuring a current is much simpler than measuring a charge. The information in the switching element is not influenced by the read-out. The read-out procedure for a memory element according to the invention is thus much simpler than the procedure in a known memory element.

In practice, the memory element is switched from one memory state into the other by a voltage pulse which is applied across the dielectric and which has such a value that the remanent polarization of the dielectric, or of one of the dielectrics if several dielectrics are present, changes. The memory element is then read out in that the current through the switching element is measured at voltages lower than the voltage belonging to a switching field of the remanent polarization of the dielectric.

The invention is not limited to the embodiments described above. Thus many switching elements may be present on the substrate 15 instead of a single switching element, while also other elements such as transistors, resistors or capacitors may be present besides the switching elements, especially when a silicon wafer is used as the substrate. In other words, the switching element may form part of an integrated circuit.

A Schottky contact is present between one of the electrodes 1, 2 and the dielectric in the embodiments, while an ohmic contact is present between the other electrode and the dielectric. It is alternatively possible for Schottky contact to be present between both electrodes and the dielectric. The switching element then comprises two Schottky barriers connected in series. In such a case the dielectric must be sufficiently thick to render it possible for the polarization of a region outside the space charge regions to influence the space charge regions belonging to the Schottky contacts.

The ferroelectric dielectric 3 may be combined with non-ferroelectric materials. Thus the dielectric 3 may comprise a thin layer of ferroelectric material with in addition a semiconducting non-ferroelectric layer. The level at which switching takes place may be influenced thereby, or the effect of the switching may be influenced. It is also possible to combine the ferroelectric dielectric with an anti-ferroelectric dielectric. In this manner it is possible to realize additional switching states of the switching element.

The switching element may also be used as a component of a transistor. For this purpose, for example, the switching element according to the invention is combined with semiconducting p- or n-type regions. A structure of the $M_1FPNM_2$ is then created, in which $M_1$, $M_2$, are the electrodes 1,2, respectively, F is a semiconducting ferroelectric dielectric, and P and N are a p- and an n-type conducting semiconductor material, respectively. The electrode 1 then acts, for example, as an emitter connection, the p-type region as a base region, and the n-type region as a collector region. The above transistor has a memory function, i.e. it can hold certain switching states.

Claims:

1. A switching element provided with two electrodes with a semiconducting dielectric therebetween, one electrode comprising a material which forms a Schottky contact with the semiconducting dielectric, with a space charge region of the Schottky contact forming a tunnelling barrier for electrons during operation, characterized in that the dielectric comprises a ferroelectric material with a remanent polarization which influences a dimension of the tunnelling barrier.

2. A switching element as claimed in claim 1, characterized in that the dielectric has a sufficiently small thickness such that a switching field of the ferroelectric material is obtained in a region of the dielectric outside the space charge region by applying a voltage across the electrodes, without breakdown occurring in the space charge region.

3. A switching element as claimed in claim 2, characterized in that the thickness of the dielectric is below 5000 Å.

4. A switching element as claimed in claim 1 comprising electrodes in the form of substantially parallel plates, characterized in that the direction of a greatest component of the remanent polarization is substantially perpendicular to said plates.

5. A switching element as claimed in claim 1, characterized in that the ferroelectric dielectric is provided epitaxially on an electrode of a metallically conducting oxide.

6. A switching element as claimed in claim 5, characterized in that the metallically conducting electrode is provided on a monocrystalline substrate.

7. A switching element as claimed in claim 1, characterized in that the dielectric comprises two or more ferroelectric materials which change the directions of their remanent polarization at different electric switching fields.

8. A switching element as claimed in claim 7, characterized in that a conducting layer is provided between the different ferroelectric materials so that the switching element comprises a number of elements connected in series.

9. A memory element comprising a switching element provided with two electrodes with a semiconducting dielectric therebetween, one electrode comprising a material which forms a Schottky contact with the semiconducting dielectric, with a space charge region of the Schottky contact forming a tunneling barrier for electrons during operation, characterized in that the dielectric comprises a ferroelectric material with a remanent polarization which influences a dimension of the tunneling barrier.

* * * * *